United States Patent [19]
Asano

[11] Patent Number: 5,929,468
[45] Date of Patent: Jul. 27, 1999

[54] COMPOUND SEMICONDUCTOR DEVICE

[75] Inventor: Tetsuro Asano, Osaka, Japan

[73] Assignee: Sanyo Electric Co., Ltd., Osaka, Japan

[21] Appl. No.: 08/959,299

[22] Filed: Oct. 28, 1997

[30] Foreign Application Priority Data

Oct. 31, 1996 [JP] Japan ................................. 8-290714
Oct. 31, 1996 [JP] Japan ................................. 8-290715

[51] Int. Cl.$^6$ ............................................. H01L 31/0328
[52] U.S. Cl. ........................... 257/197; 257/587; 257/776
[58] Field of Search ................................. 257/197, 587, 257/776

*Primary Examiner*—Mark V. Prenty
*Attorney, Agent, or Firm*—Wenderoth, Lind & Ponack, L.L.P.

[57] ABSTRACT

A compound semiconductor device has a stripe-shaped heterojunction bipolar transistor cell region mounted on a semi-insulating semiconductor substrate and comprising an array of unit transistor cells each having a base region, an emitter region, and a collector region. A base wiring electrode and a collector wiring electrode are disposed on the substrate parallel to the cell region. The base wiring electrode and the collector wiring electrode have toothed shapes connected to the base region and the collector region. A heat-radiating electrode is disposed on the substrate parallel to the cell region with the base wiring electrode or the collector wiring electrode. A relatively thick gold-plated layer is connected to the heat-radiating electrode and the emitter regions of the unit cells and has a bridge structure over the base wiring electrode or the collector wiring electrode with an insulating film interposed therebetween. First and second bonding pads are disposed on the substrate near one and opposite sides thereof and connected to the base wiring electrode and the collector wiring electrode, respectively.

8 Claims, 9 Drawing Sheets

COMPOUND SEMICONDUCTOR DEVICE

BACKGROUND OF THE INVENTION

1. Field of the Invention

The present invention relates to a compound semiconductor device, and more particularly to the structure of a semiconductor chip with a heterojunction bipolar transistor (HBT) mounted on a semi-insulating compound semiconductor substrate.

2. Description of the Prior Art

In recent years, there has been a demand for high-output-power semiconductor devices that can operate in a GHz band in view of the widespread use of consumer products that operate in an ultra-high frequency band, such as portable telephone units.

Heterojunction bipolar transistors (HBT) have an emitter-to-base junction comprising a different material such as AlGaAs or GaInP/GaAs for high electron mobility and a greater emitter band gap than a base band gap for high electron injection efficiency. Therefore, since the heterojunction bipolar transistors can have a high output power rate ranging from 1 W to 2 W in the GHz band, they are attracting attention as meeting the above demand.

Various documents, e.g., IEEE ELECTRON DEVICE LETTERS, Vol. 14, No. 10, October 1990, pages 493–495, and Japanese patent No. 2522280, disclose heterojunction bipolar transistors using compound semiconductor materials. The disclosed heterojunction bipolar transistors comprise an $n^+$-GaAs subcollector layer, an n-GaAs collector layer, a $p^+$-GaAs base layer, an n-AlGaAs emitter layer, an $n^+$-GaAs emitter contact layer, etc. that are successively deposited in a mesa structure on a semi-insulating GaAs substrate.

The heterojunction bipolar transistors suffer the problem of heat radiation because their current density is very high. To solve this problem, the heterojunction bipolar transistors disclosed in the above documents have a heat-radiating electrode mounted on the semi-insulating GaAs substrate. A cell region where the collector layer, the base layer, and the emitter layer are positioned in the mesa configuration, a base wiring electrode, and a collector wiring electrode are all covered with an insulating film. An opening is defined in the insulating film in communication with the emitter layer and the heat-radiating electrode, and the insulating film is covered with a thick gold-plated layer. Heat generated from the emitter layer in the cell region is radiated from the thick gold-plated layer, and is also transferred through the heat-radiating electrode to the semiconductor chip and a package in which the semiconductor chip is fixedly disposed, thereby cooling the region where the heat is generated.

The heterojunction bipolar transistors disclosed in the above documents have a plurality of stripe-shaped cell regions on a semiconductor chip, each comprising a mesa structure of collector, base, and emitter layers, collector wiring electrodes connected to the collector layers, base wiring electrodes connected to the base layers that serve as cells. Heat-radiating electrode regions are disposed in outer peripheral areas of the semiconductor chip on which the stripe-shaped cell regions, the collector wiring electrodes, and the base wiring electrodes are disposed. The stripe-shaped cell regions, the collector wiring electrodes, and the base wiring electrodes are covered with an insulating film, which is covered with a thick gold-plated layer over its entire surface.

Specifically, the emitter layers of the stripe-shaped cell regions and heat-radiating electrodes on both ends of the semiconductor chip are connected by the thick gold-plated layer which is shaped like a bridge and has a thickness of about 22 µm. Heat that is generated in the vicinity of base-to-collector junctions is radiated into the air from the thick gold-plated layer that is deposited on the entire surface of the semiconductor chip, and is also transferred from the heat-radiating electrodes on the both ends of the semiconductor chip to a package on which the semiconductor chip is fixedly mounted.

While the heterojunction bipolar transistors can produce high output power in the ultra-high frequency band, they are subject to positive feedback of the output power due to a temperature rise. Generally, high-output-power transistors comprise a number of unit transistor cells each having emitter and base regions disposed in a collector region. These unit transistor cells are connected into a single transistor. When the temperature of one of the unit transistor cells rises, a collector current with respect to the same base bias voltage increases, resulting in a temperature rise. The temperature rise then causes the collector current to increase. This positive feedback phenomenon causes the current to concentrate on the single unit transistor cell until the high-output-power transistor will suffer a thermal breakdown.

To solve the above problem, it is important that the radiation of heat from the unit transistor cells that are dispersed widely on the transistor chip be made as uniform as possible for thereby eliminating localized temperature rises which would otherwise be developed if the heat radiation were not uniform on the transistor chip.

SUMMARY OF THE INVENTION

It is therefore an object of the present invention to provide a compound semiconductor device which uniformizes the radiation of heat from unit transistor cells of a heterojunction bipolar transistor, and hence which is highly reliable and is capable of producing high output power stably in an ultra-high frequency band.

According to the present invention, there is provided a compound semiconductor device comprising a semi-insulating semiconductor substrate, a stripe-shaped heterojunction bipolar transistor cell region mounted on the semi-insulating semiconductor substrate and comprising an array of unit transistor cells each having a base region, an emitter region, and a collector region, a base wiring electrode or a collector wiring electrode disposed on the semi-insulating semiconductor substrate parallel to the stripe-shaped heterojunction bipolar transistor cell region, the base wiring electrode or the collector wiring electrode having a toothed shape connected to the base region or the collector region, a heat-radiating electrode disposed on the semi-insulating semiconductor substrate parallel to the stripe-shaped heterojunction bipolar transistor cell region with the base wiring electrode or the collector wiring electrode; a relatively thick gold-plated layer connected to the heat-radiating electrode and the emitter regions of the unit cells and having a bridge structure over the base wiring electrode or the collector wiring electrode with an insulating film interposed therebetween, a first bonding pad disposed on the semi-insulating semiconductor substrate near one side thereof and connected to the base wiring electrode, and a second bonding pad disposed on the semi-insulating semiconductor substrate near an opposite side thereof and connected to the collector wiring electrode.

According to the present invention, there is also provided a compound semiconductor device comprising a semi-insulating semiconductor substrate, a stripe-shaped heterojunction bipolar transistor cell region mounted on the semi-insulating semiconductor substrate and comprising an array of unit transistor cells each having a base region, an emitter region, and a collector region, a base wiring electrode and a collector wiring electrode disposed on the semi-insulating semiconductor substrate parallel to the stripe-shaped heterojunction bipolar transistor cell region, the base wiring electrode and the collector wiring electrode having respective toothed shapes connected to the base region and the collector region, respectively, a plurality of heat-radiating electrodes disposed on the semi-insulating semiconductor substrate parallel to the stripe-shaped heterojunction bipolar transistor cell region with the base wiring electrode and the collector wiring electrode, a relatively thick gold-plated layer connected to the heat-radiating electrode and the emitter regions of the unit cells and having a bridge structure over at least the collector wiring electrode with an insulating film interposed therebetween, a first bonding pad disposed on the semi-insulating semiconductor substrate near one side thereof and connected to the base wiring electrode, and a second bonding pad disposed on the semi-insulating semiconductor substrate near an opposite side thereof and connected to the collector wiring electrode.

The relatively thick gold-plated layer may be disposed in covering relation to the stripe-shaped heterojunction bipolar transistor cell region, the collector wiring electrode, and the heat-radiating electrode.

Alternatively, the relatively thick gold-plated layer may be disposed in covering relation to the stripe-shaped heterojunction bipolar transistor cell region, the base wiring electrode, the collector wiring electrode, and the heat-radiating electrode.

According to the present invention, the heat-radiating electrode is disposed on the semi-insulating semiconductor substrate parallel to the stripe-shaped heterojunction bipolar transistor cell region with the base wiring electrode and/or the collector wiring electrode interposed therebetween, and is connected by the bridge structure of the gold-plate layer. Therefore, heat from the emitter regions of the unit cells is transferred to the heat-radiating electrode over a short distance. Since the distances from the unit cells to the heat-radiating electrodes are substantially equal to each other, the heat from the unit cells can be radiated uniformly, thereby preventing a current from concentrating on certain unit cells due to positive feedback. As a result, the compound semiconductor device is protected against a thermal breakdown.

The cell region, the base wiring electrode, the collector wiring electrode, and the heat-radiating electrode are disposed parallel to each other in a substantially central portion of the semiconductor substrate, and the first bonding pad connected to the base wiring electrode is disposed on one side of the semiconductor substrate whereas the second bonding pad connected to the collector wiring electrode is disposed on the opposite side of the semiconductor substrate. Therefore, the area of the semiconductor substrate is effectively utilized, and the area occupied by the gold-plated layer and the heat-radiating electrode is efficiently large with respect to the area of the semiconductor substrate. The compound semiconductor device is thus capable of radiating heat effectively.

In the structure where the gold-plated layer does not cover the base wiring electrode, the stray capacitance between emitters and bases is prevented from increasing. Thus, the compound semiconductor device is prevented from being degraded with respect to high-frequency characteristics.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
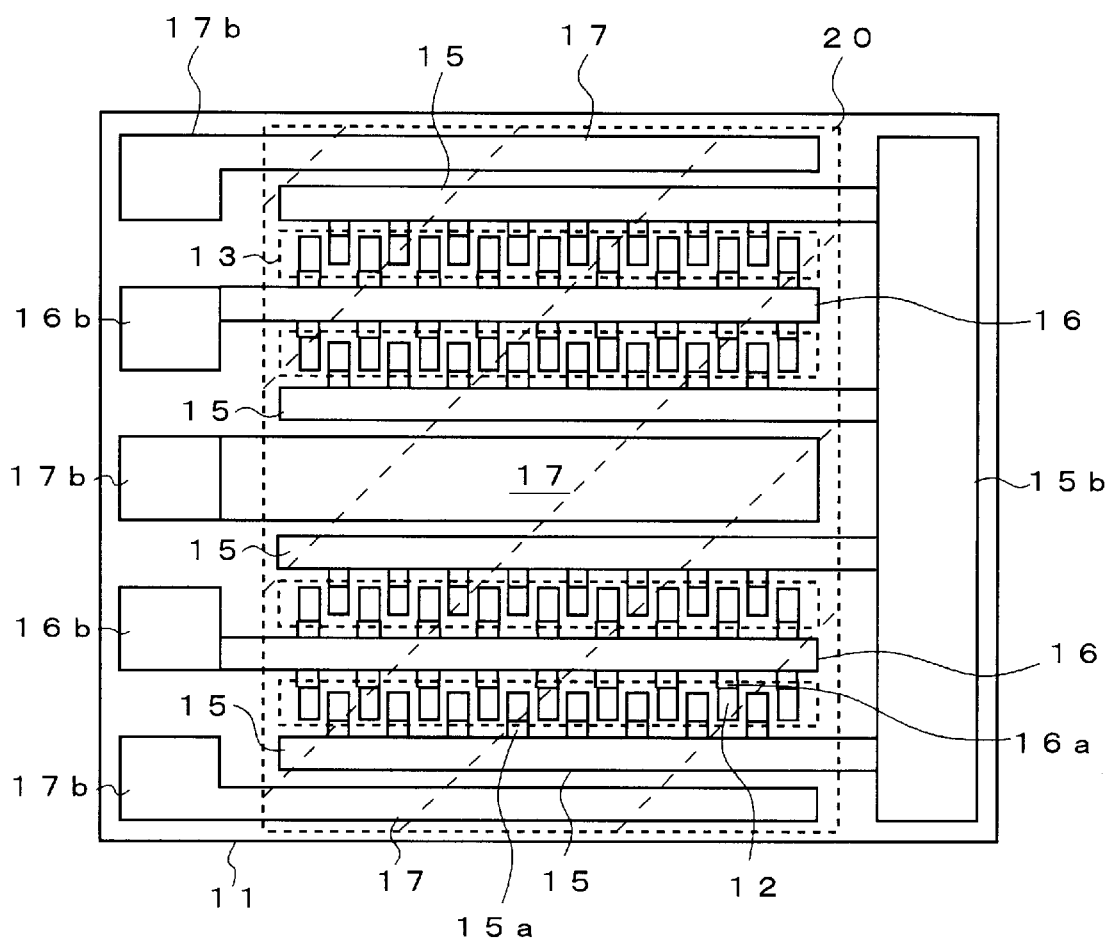
FIG. 1 is a plan view of a pattern of a compound semiconductor device according to a first embodiment of the present invention.

As shown in FIG. 1, a compound semiconductor device according to a first embodiment of the present invention comprises a plurality of stripe-shaped heterojunction bipolar transistor cell regions 13 each comprising an array of unit transistor cells 12, the cell regions 13 being disposed on a rectangular semi-insulating substrate (chip) 11 of GaAs. Each of the cell regions 13 comprises base regions and emitter regions, which belong to the unit cells 12, disposed in a mesa structure on mesa-shaped collector regions.

The compound semiconductor device also includes a plurality of stripe-shaped collector wiring electrodes 15 and base wiring electrodes 16 that extend parallel to each other and are disposed on opposite sides of the cell regions 13. Each of the base wiring electrodes 16 has toothed branch junctions 16a disposed adjacent to the base regions of the unit cells 12. Similarly, each of the collector wiring electrodes 15 has toothed branch junctions 15a disposed adjacent to the collector regions of the unit cells 12.

Stripe-shaped heat-radiating emitter wiring electrodes 17 are disposed on the semi-insulating substrate 11 parallel to the stripe-shaped cell regions 13 with the collector wiring electrodes 15 interposed therebetween. The heat-radiating emitter wiring electrodes 17 are spaced from the unit cells 12 by equal distances.

A bonding pad 15b is connected to respective ends of the collector wiring electrodes 15. Bonding pads 16b are connected to respective ends of the base wiring electrodes 16 remotely from the bonding pad 15b. Bonding pads 17b are connected to respective ends of the heat-radiating emitter electrodes 17 remotely from the bonding pad 15b. The bonding pads 16b, 17b are disposed in an array on one side of the semi-insulating substrate 11, whereas the bonding pad 15*b* is disposed on the opposite side of the semi-insulating substrate 11. The bonding pad 15*b* extends transversely to the collector wiring electrodes 15.

The cell regions 13 and the wiring electrodes 15, 16, 17 are covered with an insulating film over a substantially central portion of the semi-insulating substrate 11 except the bonding pads 15*b*, 16*b*, 17*b*. The insulating film has openings aligned with the emitters of the unit cells 12 and the heat-radiating emitter wiring electrodes 17, and is fully covered with a heat-radiating thick gold-plated layer 20. Therefore, the emitters of the unit cells 12 and the heat-radiating emitter wiring electrodes 17 are connected by bridge-shaped structures of the gold-plated layer 20 (see FIG. 4).

Figure 2:
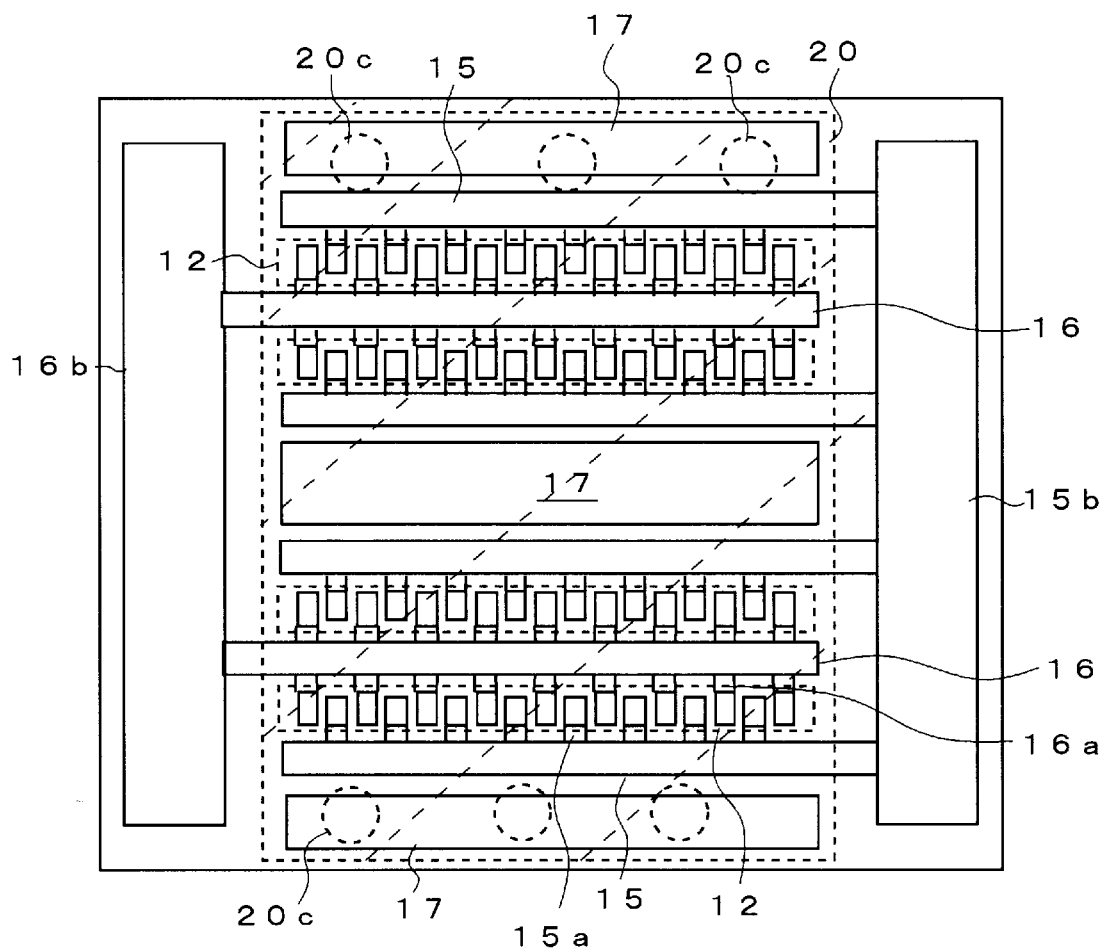
FIG. 2 is a plan view of a pattern of a compound semiconductor device according to a second embodiment of the present invention.

FIG. 2 shows a compound semiconductor device according to a second embodiment of the present invention. Those parts shown in FIG. 2 which are identical to those shown in FIG. 1 are denoted by identical reference characters, and will not be described in detail below. The compound semiconductor device according to the second embodiment differs from the compound semiconductor device according to the first embodiment in that gold wires to be connected to the heat-radiating emitter wiring electrodes 17 are bonded to the gold-plated layer 20, thereby dispensing with the bonding pads 17*b* shown in FIG. 1. Since the gold-plated layer 20 allows gold wires to be bonded well thereto, the gold wires can be bonded anywhere to the gold-plated layer 20, e.g., to regions 20*c* thereof. Since heat from the gold-plated layer 20 can be radiated directly from the gold wires joined thereto, the heat-radiating capability of the compound semiconductor device is increased.

Figure 3:
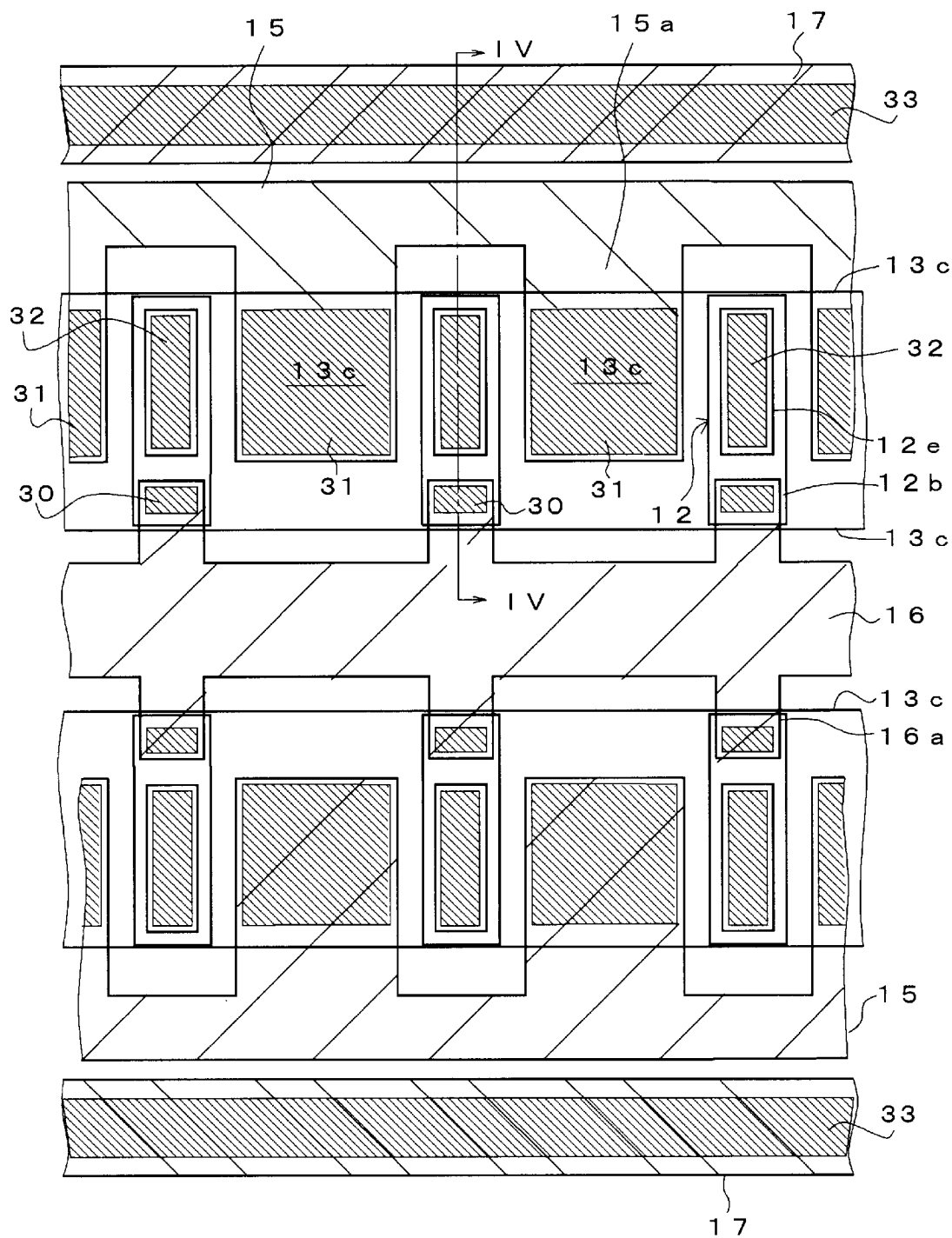
FIG. 3 is an enlarged fragmentary plan view of unit transistor cells of the compound semiconductor devices shown in FIGS. 1 and 2.
Figure 4:
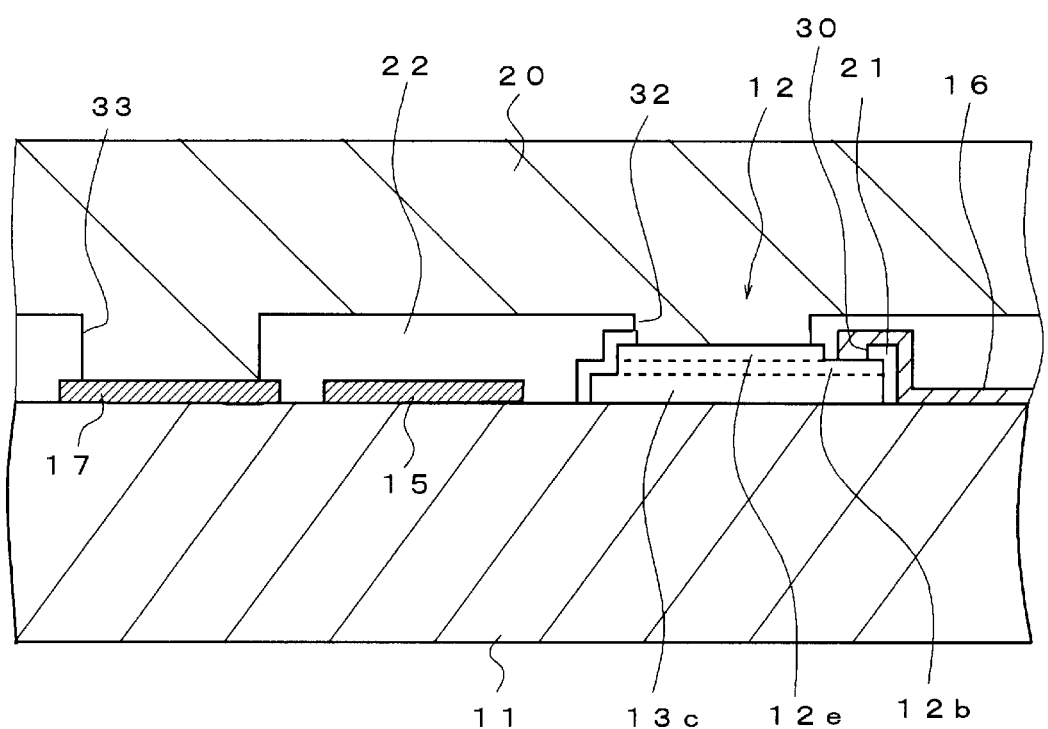
FIG. 4 is an enlarged cross-sectional view taken along line IV—IV of FIG. 3.

FIGS. 3 and 4 show at an enlarged scale the compound semiconductor device near unit cells according to each of the first and second embodiments. As shown in FIGS. 3 and 4, each of the cell regions 13 has unit cell 12 each comprising a base layer 12*b* and an emitter layer 12*e*, which are formed in a mesa structure, disposed on a mesa-shaped collector layer 13*c*. The toothed branch junctions 16*a* of each of the base electrodes 16 are connected to the mesa-shaped base layers 12*b* through openings (contact hole 30) defined in an insulating film 21 of SiN or the like. The toothed branch junctions 15*a* of each of the collector electrodes 15 are connected through contact hole 31 to the mesa-shaped collector layers 13*c* disposed in recesses between the mesa-shaped unit cells 12.

As shown in FIG. 4, the collector wiring electrodes 15 and the base wiring electrodes 16 are covered with an insulating film 22 of polyimide or the like. The gold-plated layer 20, which has a thickness ranging from 20 μm to 30 μm, is disposed on the insulating film 22. The gold-plated layer 20 is connected through openings (contact holes 32, 33) defined in the insulating film 22 to the emitter layers 12*e* and the heat-radiating emitter wiring electrodes 17 through bridge-shaped structures of the gold-plated layer 20.

A process of manufacturing the compound semiconductor devices according to the first and second embodiments will be described below.

First, a substrate assembly which comprises a kind of compound semiconductor material deposited on a semi-insulating substrate by epitaxial growth is prepared. Specifically, the substrate assembly comprises a GaAs layer, which serves as the subcollector layer, deposited on the semi-insulating GaAs substrate 11 by epitaxial growth, an n-GaAs collector layer, which serves as the base layer 12*b*, deposited on the GaAs layer by epitaxial growth, and a p-GaAs base layer, which serves as the base layer 12*b*, deposited on the n-GaAs collector layer by epitaxial growth.

A transition layer characterized by a transition from a GaAs layer to an AlGaAs layer is deposited on the base layer 12*b* by epitaxial growth. An n-type AlGaAs layer having a larger band gap than the base layer that serves as the core of the heterojunction bipolar transistor is deposited on the transition layer by epitaxial growth. A transition layer characterized by a transition to a GaAs layer is deposited on the n-type AlGaAs layer by epitaxial growth. Then, an n$^+$-type GaAs layer is deposited on the transition layer by epitaxial growth.

The surface formed so far is patterned by photolithography and etched to form the mesa structure of the emitter layer 12*e* for forming the emitter regions. Then, the surface is patterned by photolithography and etched to form the mesa structures of the base layer 12*b* and the collector layer 13*c*.

Thereafter, AuGe/Ni/Au electrodes are selectively formed for ohmically contacting the toothed portion of the base and collector electrodes to the base layer 12*b* and the collector layer 13*c* in the mesa structure of the transistor cell. Namely, after a photoresist film is coated, it is patterned by photolithography. Then, a layer of AuGe/Ni/Au is evaporated and selectively lifted off to form contacting pattern on the base layer 12*b* and the collector layer 12*c*, which are thereafter securely brought into contact with the semiconductor substrate with an alloy. An insulating film of SiN, for example, is deposited to a thickness of 2000 Å on the entire surface by CVD, and then patterned by photolithography for forming contact openings therein.

Then, the base electrodes 16, the collector electrodes 15 and the heat radiating electrodes 17 are formed. Namely, the insulating film of SiN, for example, is patterned by photolithography for forming contact openings therein. A layer of Ti/Pt/Au is evaporated on the surface, and patterned by photolithography for forming base wiring electrodes 16 with toothed portion for contacting the base layer 12*b*, collector wiring electrodes 15 with toothed portion for contacting the collector layer 13*c* and the heat radiating electrodes 17.

Then, the entire surface formed so far is coated with a film of polyimide, which is then cured into the insulating film 22. The film of polyimide is thick enough to sufficiently cover the mesa-shaped unit cells. Then, openings are formed in the insulating film 22 for connecting a gold-plated layer to the emitter regions 12*e* and the heat-radiating electrodes 17.

Thereafter, a film of Ti/Pt/Au is evaporated on the entire surface formed so far, and then covered with a resist film except for those portions to be covered with a gold-plated layer, by photolithography. Then, the gold-plated layer 20 having a thickness ranging from 20 μm to 30 μm is formed by electrolytic plating. The emitter layer 12*e* is now connected to the heat-radiating emitter wiring electrodes 17 by the thick gold-plated layer 20. Then, the unwanted film of Ti/Pt/Au is removed by ion milling, thus completing the heterojunction bipolar transistor.

In the above embodiment, the gold plate layer 20 extends over the collector electrodes 15 and connects the emitter layer 12*e* to the heat-radiating emitter wiring electrodes 17 at a minimum distance. However, the gold plate layer 20 may connect them over the base wiring electrodes 16 at a minimum distance. While the gold-plated layer 20 is employed for radiating and transferring heat in the above embodiment, a copper-plated layer or a silver-plated layer may be employed in place of the gold-plated layer 20.

As described above, the emitter regions of the unit cells are connected to the heat-radiating electrodes through bridge structures of the gold-plated layer uniformly at a minimum distance. Therefore, the radiation of heat from the unit cells is uniformized while preventing a current from concentrating on some of the unit cells. Since the bonding pads of the base electrodes are positioned on one side of the rectangular semiconductor chip and the bonding of the collector electrodes is positioned on the opposite side thereof, the unit cells can be positioned in a pattern for efficient heat radiation, and hence the heat generated by the unit cells can uniformly be radiated without causing any localized heat radiation.

Figure 5:
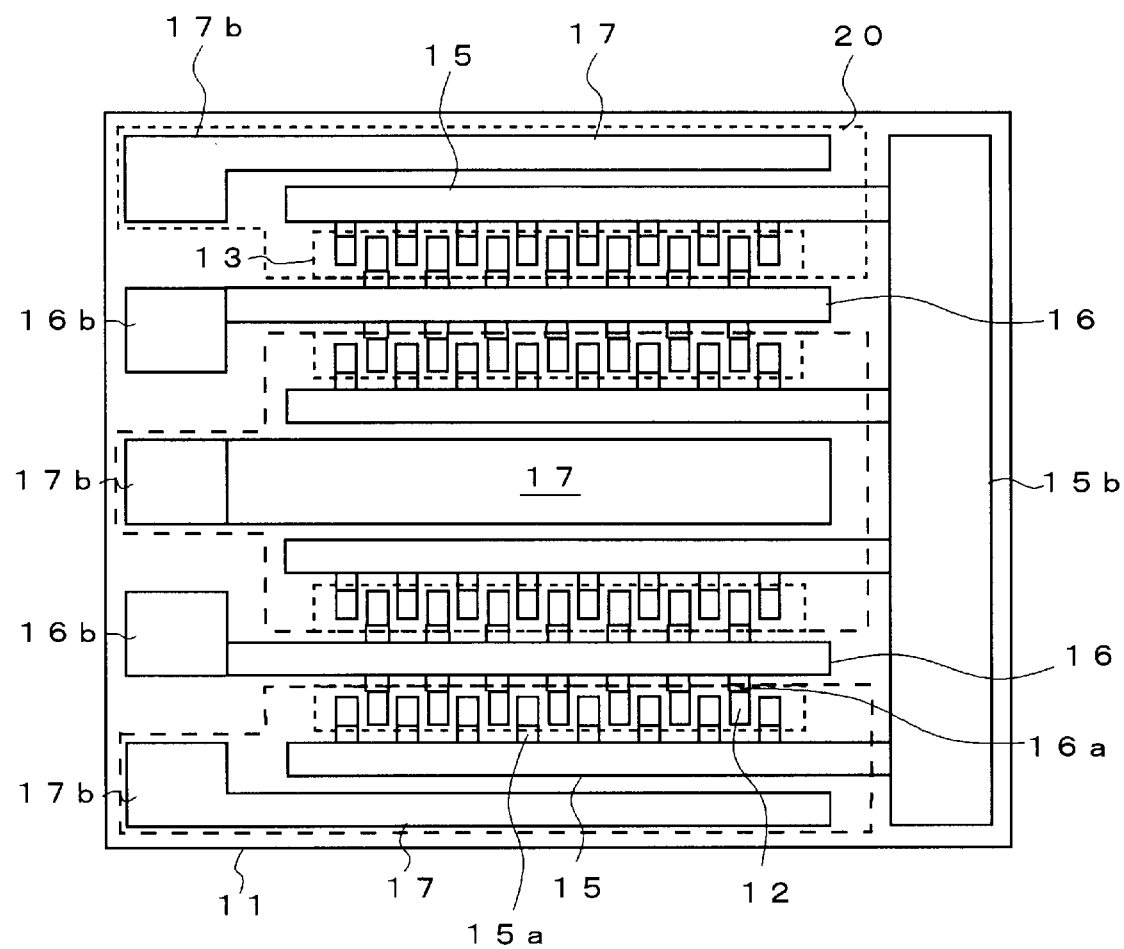
FIG. 5 is a plan view of a pattern of a compound semiconductor device according to a third embodiment of the present invention.
Figure 6:
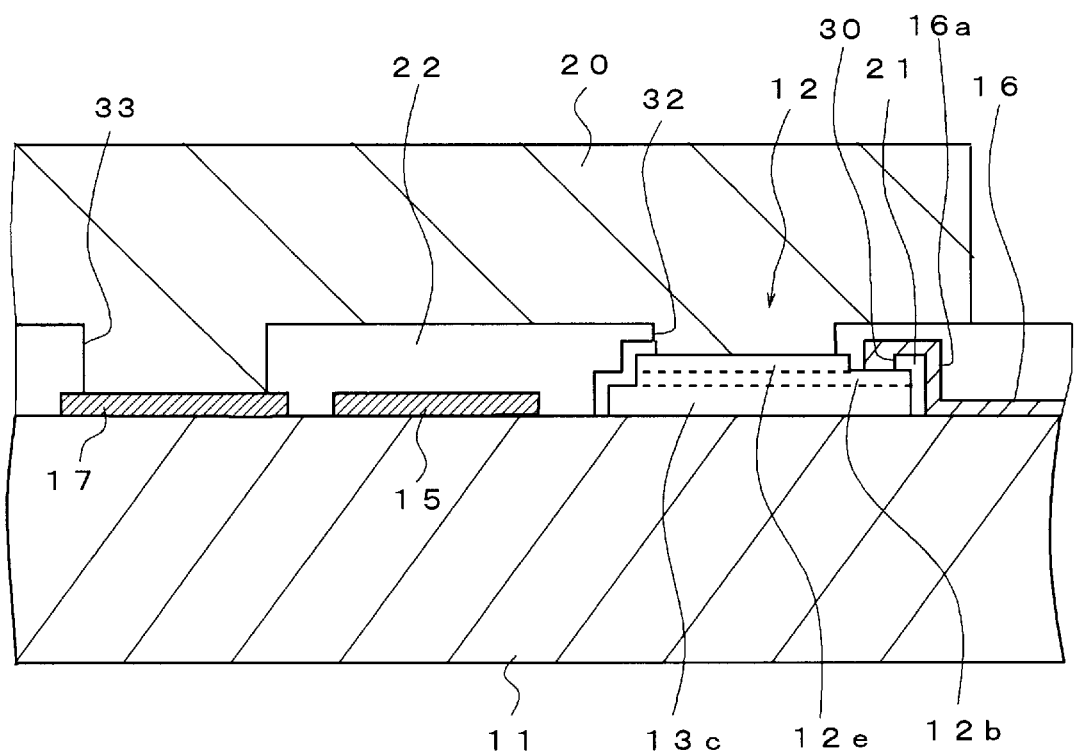
FIG. 6 is a view similar to FIG. 4, showing the compound semiconductor device according to the third embodiment.

FIGS. 5 and 6 show a compound semiconductor device according to a third embodiment of the present invention. The compound semiconductor device according to the third embodiment differs from the compound semiconductor device according to the first and second embodiments in that the gold-plated layer 16 does not cover the base wiring electrodes 16, but substantially fully covers other chip portions including the cell regions 13 and the heat-radiating emitter wiring electrodes 17.

Since the gold-plate layer 20 does not cover the base wiring electrodes 16, but substantially fully covers other chip portions, it is effective to prevent the stray capacitance between the emitters and the bases from increasing.

Figure 7:
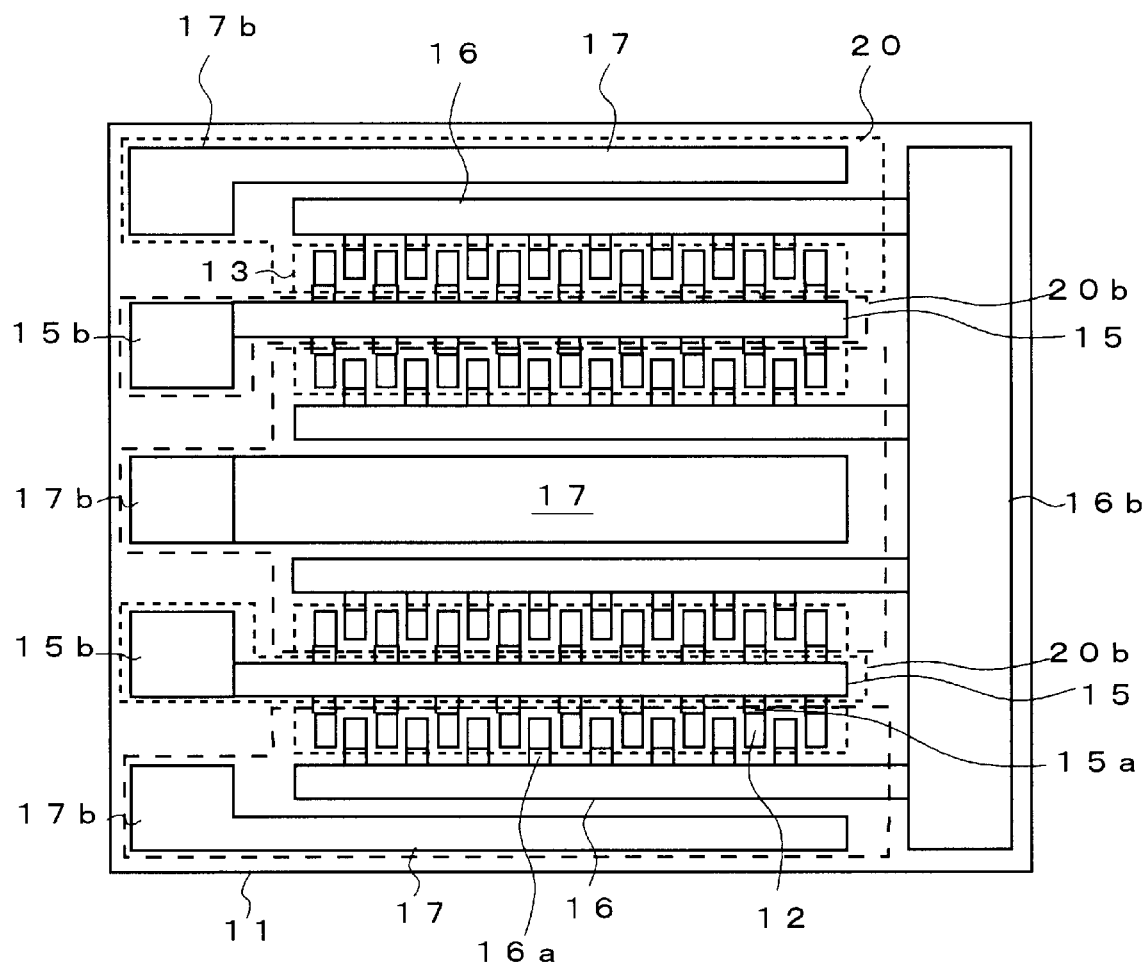
FIG. 7 is a plan view of a pattern of a compound semiconductor device according to a fourth embodiment of the present invention.
Figure 8:
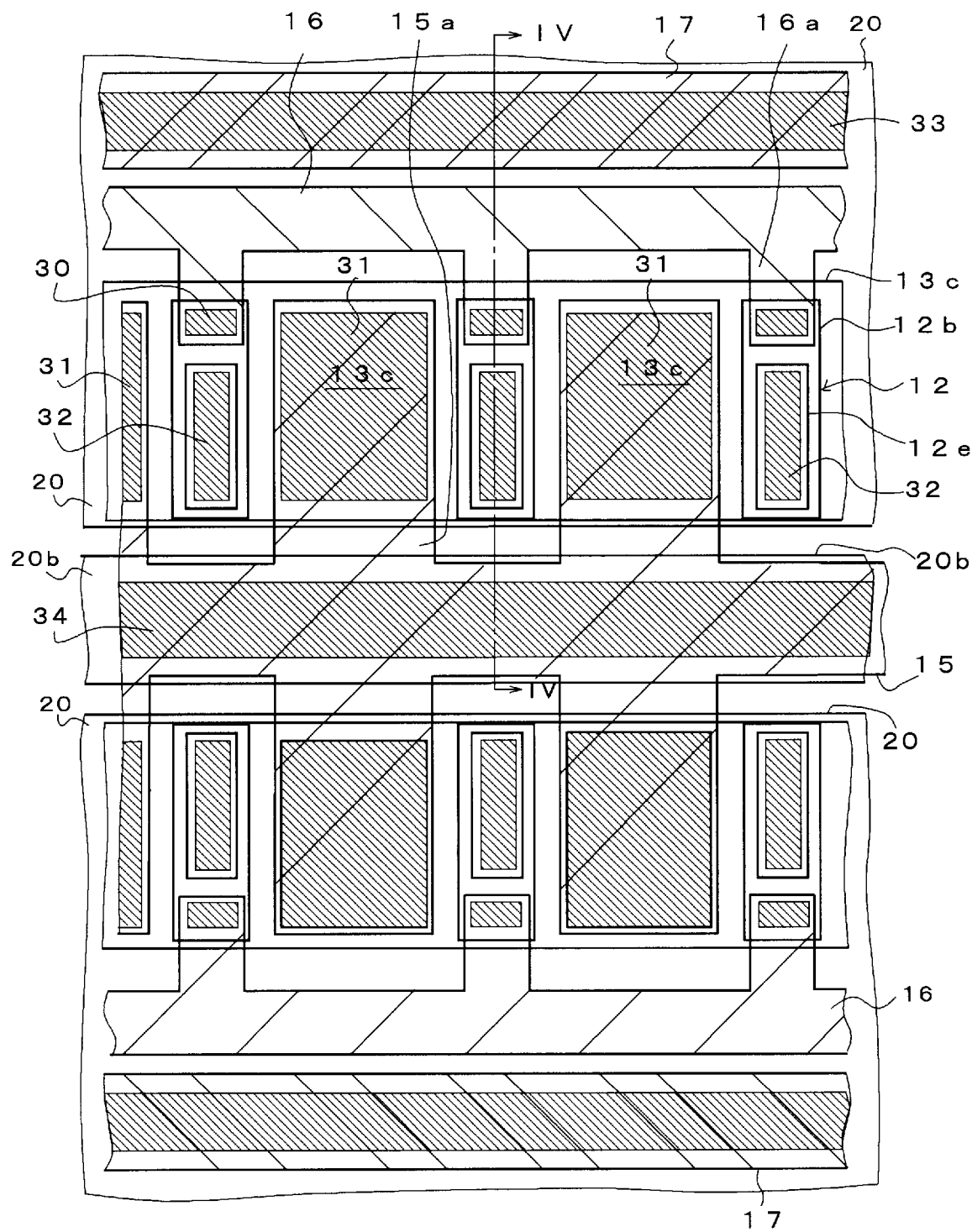
FIG. 8 is an enlarged fragmentary plan view of unit transistor cells of the compound semiconductor devices shown in FIG. 7.
Figure 9:
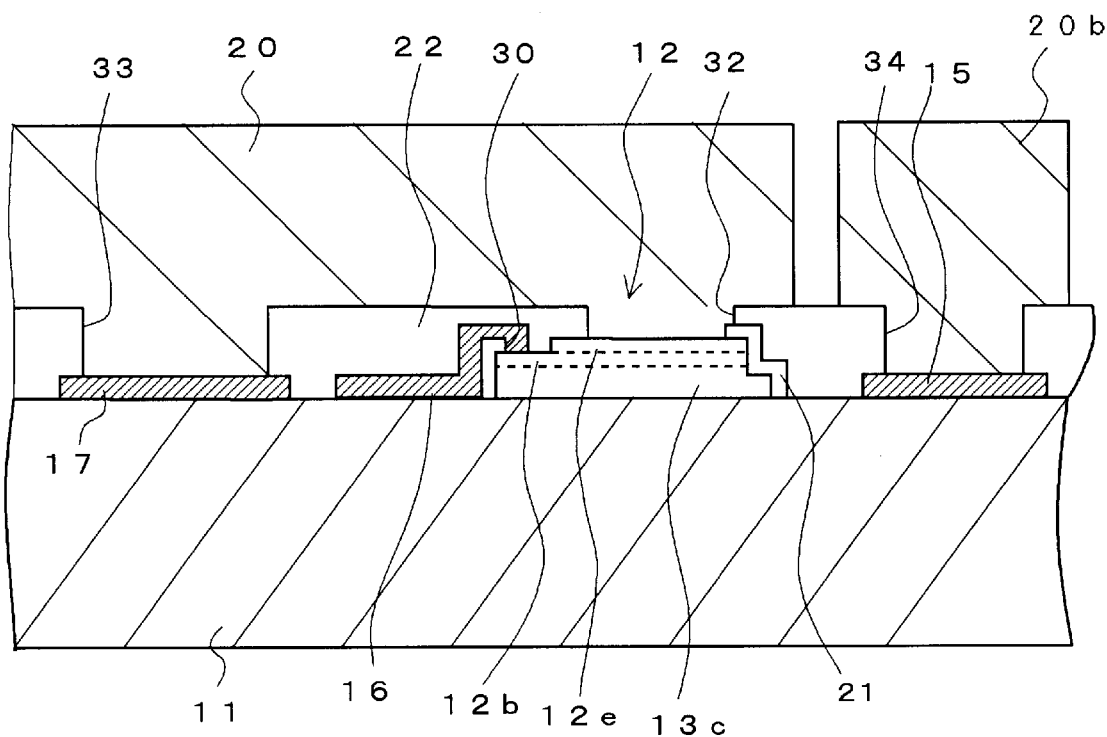
FIG. 9 is a view similar to FIG. 4, showing the compound semiconductor device according to the fourth embodiment.

FIGS. 7, 8 and 9 show a compound semiconductor device according to a fourth embodiment of the present invention. Those parts shown in FIG. 7, 8 and 9 which are identical to those shown in FIG. 1 through FIG. 6 are denoted by identical reference characters, and will not be described in detail below. The compound semiconductor device according to the third embodiment differs from the compound semiconductor device according to the first through third embodiments in that the gold-plated layer is divided into two kinds of layers 20 and 20b. The first gold-plated layer 20 which is connected to emitters of the unit cells 12 and heat radiating electrode 17 does not cover collector wiring electrode 15, but covers the stripe-shaped transistor cell region 12, base wiring electrode 16 and heat radiating electrode 17. The second gold-plated layer 20b covers only collector wiring electrode connected therebetween. Therefore, the first gold-plated wiring electrode 20 and the second gold-plated wiring electrode are electrically and physically separated therebetween. The first gold-plated wiring electrode 20 has a bridge structure which connects the emitter regions of the unit cells 12 and heat radiating electrode 17 over the stripe-shaped base wiring electrode 16. The second gold-plated layer 20b which is connected to the collector wiring electrode of Ti/Pt/Au film via contact holes through insulating film interposed therebetween, thereby decreasing resistance of the collector wiring electrode.

As shown in FIGS. 8 and 9, each of the cell regions 13 has unit cell 12 each comprising a base layer 12b and an emitter layer 12e, which are formed in a mesa structure, disposed on a mesa-shaped collector layer 13c. The toothed branch junctions 16a of each of the base wiring electrodes 16 are connected to the mesa-shaped base layers 12b through openings (contact hole 30) defined in an insulating film 21 of SiN or the like. The toothed branch junctions 15a of each of the collector electrodes 15 are connected through contact hole 30 to the mesa-shaped collector layers 13c disposed in recesses between the mesa-shaped unit cells 12.

As shown in FIG. 9, the collector wiring electrodes 15 and the base wiring electrodes 16 are covered with an insulating film 22 of polyimide or the like. The gold-plated layer 20, which has a thickness ranging from 20 $\mu$m to 30 $\mu$m, is disposed on the insulating film 22. The gold-plated layer 20 is connected through openings (contact holes 32, 33) defined in the insulating film 22 to the emitter layers 12e and the heat-radiating emitter wiring electrodes 17 by bridge-shaped structures over the base wiring electrode 16. The gold-plated layer 20b is connected through openings (contact hole 34) defined in the insulating film 22 to the collector wiring electrodes 15, and the layer 20b is disposed thereon.

The first gold-plated layer 20 and the second gold-plated layer 20b, both having a thickness ranging from 20 $\mu$m to 30 $\mu$m, are simultaneously formed by electrolytic plating on the insulating layer in accordance with photo-resist pattern formed thereon. In the bottom portion of the contact holes 31, 32, AuGe/Ni/Au electrodes are selectively formed for ohmic contact between semiconductor layer and the Ti/Pt/Au electrodes.

Heterojunction bipolar transistors based on the principles of the present invention are highly stable against a thermal breakdown due to current concentration. According to the present invention, it is possible to manufacture highly stable and reliable heterojunction bipolar transistors which have high output power characteristics in a high frequency range such as a GHz band.

Although certain preferred embodiments of the present invention have been shown and described in detail, it should be understood that various changes and modifications may be made therein without departing from the scope of the appended claims.

What is claimed is:

1. A compound semiconductor device comprising:
   a semi-insulating semiconductor substrate;
   a stripe-shaped heterojunction bipolar transistor cell region mounted on said semi-insulating semiconductor substrate and comprising an array of unit transistor cells each having a base region, an emitter region, and a collector region;
   a base wiring electrode or a collector wiring electrode disposed on said semi-insulating semiconductor substrate parallel to said stripe-shaped heterojunction bipolar transistor cell region, said base wiring electrode or said collector wiring electrode having a toothed shape connected to said base region or said collector region;
   a heat-radiating electrode disposed on said semi-insulating semiconductor substrate parallel to said stripe-shaped heterojunction bipolar transistor cell region with said base wiring electrode or said collector wiring electrode;
   a relatively thick gold-plated layer connected to said heat-radiating electrode and the emitter regions of the unit cells and having a bridge structure over said base wiring electrode or said collector wiring electrode with an insulating film interposed therebetween;
   a first bonding pad disposed on said semi-insulating semiconductor substrate near one side thereof and connected to said base wiring electrode; and
   a second bonding pad disposed on said semi-insulating semiconductor substrate near an opposite side thereof and connected to said collector wiring electrode.

2. A compound semiconductor device according to claim 1, wherein said relatively thick gold-plated layer is disposed in covering relation to said stripe-shaped heterojunction bipolar transistor cell region, said collector wiring electrode, and said heat-radiating electrode.

3. A compound semiconductor device according to claim 1, wherein said relatively thick gold-plated layer is disposed in covering relation to said stripe-shaped heterojunction bipolar transistor cell region, said base wiring electrode, said collector wiring electrode, and said heat-radiating electrode.

4. A compound semiconductor device comprising:

a semi-insulating semiconductor substrate;

a stripe-shaped heterojunction bipolar transistor cell region mounted on said semi-insulating semiconductor substrate and comprising an array of unit transistor cells each having a base region, an emitter region, and a collector region;

a base wiring electrode and a collector wiring electrode disposed on said semi-insulating semiconductor substrate parallel to said stripe-shaped heterojunction bipolar transistor cell region, said base wiring electrode and said collector wiring electrode having respective toothed shapes connected to said base region and said collector region, respectively;

a plurality of heat-radiating electrodes disposed on said semi-insulating semiconductor substrate parallel to said stripe-shaped heterojunction bipolar transistor cell region with said base wiring electrode and said collector wiring electrode;

a relatively thick gold-plated layer connected to said heat-radiating electrode and the emitter regions of the unit cells and having a bridge structure over at least said collector wiring electrode with an insulating film interposed therebetween;

a first bonding pad disposed on said semi-insulating semiconductor substrate near one side thereof and connected to said base wiring electrode; and a second bonding pad disposed on said semi-insulating semiconductor substrate near an opposite side thereof and connected to said collector wiring electrode.

5. A compound semiconductor device according to claim 4, wherein said relatively thick gold-plated layer is disposed in covering relation to said stripe-shaped heterojunction bipolar transistor cell region, said collector wiring electrode, and said heat-radiating electrode.

6. A compound semiconductor device according to claim 4, wherein said relatively thick gold-plated layer is disposed in covering relation to said stripe-shaped heterojunction bipolar transistor cell region, said base wiring electrode, said collector wiring electrode, and said heat-radiating electrode.

7. A compound semiconductor device comprising:

a semi-insulating semiconductor substrate;

a stripe-shaped heterojunction bipolar transistor cell region mounted on said semi-insulating semiconductor substrate and comprising an array of unit transistor cells each having a base region, an emitter region, and a collector region;

a base wiring electrode and a collector wiring electrode disposed on said semi-insulating semiconductor substrate parallel to said stripe-shaped heterojunction bipolar transistor cell region, said base wiring electrode and said collector wiring electrode having respective toothed shapes connected to said base region and said collector region, respectively;

a plurality of heat-radiating electrodes disposed on said semi-insulating semiconductor substrate parallel to said stripe-shaped heterojunction bipolar transistor cell region, said base wiring electrode and said collector wiring electrode;

a first relatively thick gold-plated layer connected to said heat-radiating electrode and the emitter regions of the unit cells and having a bridge structure over said base wiring electrode with an insulating film interposed therebetween;

a second relatively thick gold-plated layer connected to said collector wiring electrode thereby reducing electrical resistance of said collect or wiring electrode;

a first bonding pad disposed on said semi-insulating semiconductor substrate near one side thereof and connected to said base wiring electrode; and a second bonding pad disposed on said semi-insulating semiconductor substrate near an opposite side thereof and connected to said collector wiring electrode.

8. A compound semiconductor device according to claim 4, wherein said relatively thick gold-plated layer is disposed in covering relation to said cell region, said stripe-shaped heterojunction bipolar transistor cell region, said base wiring electrode, and said heat-radiating electrode.

* * * * *